United States Patent
Sakai

(10) Patent No.: US 9,403,366 B2
(45) Date of Patent: Aug. 2, 2016

(54) METHOD OF MANUFACTURING A LIQUID EJECTING HEAD

(75) Inventor: Tomohiro Sakai, Chino (JP)

(73) Assignee: Seiko Epson Corporation, Tokyo (JP)

( * ) Notice: Subject to any disclaimer, the term of this patent is extended or adjusted under 35 U.S.C. 154(b) by 974 days.

(21) Appl. No.: 13/296,102

(22) Filed: Nov. 14, 2011

(65) Prior Publication Data

US 2012/0117770 A1     May 17, 2012

(30) Foreign Application Priority Data

Nov. 16, 2010   (JP) ................................. 2010-256346

(51) Int. Cl.

| | |
|---|---|
| *B41J 2/16* | (2006.01) |
| *H01L 41/318* | (2013.01) |
| *H01L 41/187* | (2006.01) |
| *C04B 35/468* | (2006.01) |
| *B41J 2/14* | (2006.01) |

(52) U.S. Cl.
CPC ................ *B41J 2/161* (2013.01); *B41J 2/1623* (2013.01); *B41J 2/1628* (2013.01); *B41J 2/1629* (2013.01); *B41J 2/1632* (2013.01); *B41J 2/1642* (2013.01); *B41J 2/1645* (2013.01); *B41J 2/1646* (2013.01); *H01L 41/1871* (2013.01); *H01L 41/1876* (2013.01); *H01L 41/1878* (2013.01); *H01L 41/318* (2013.01); *B41J 2002/14241* (2013.01); *B41J 2002/14419* (2013.01); *B41J 2202/03* (2013.01); *C04B 35/4682* (2013.01); *C04B 2235/768* (2013.01); *Y10T 29/42* (2015.01); *Y10T 29/49401* (2015.01)

(58) Field of Classification Search
CPC ............ H01L 41/1876; H01L 41/1878; H01L 41/318; H01L 41/1871; B41J 2/161; B41J 2/1623; B41J 2/1628; B41J 2/1629; B41J 2/1632; B41J 2/1642; B41J 2/1645; B41J 2/1646; B41J 2002/14419; B41J 2202/03; B41J 2002/14241; Y10T 29/42; Y10T 29/49401; C04B 2235/768; C04B 35/4682
USPC .......... 29/25.35, 890.1, 830, 846; 347/68, 70, 347/71
See application file for complete search history.

(56) References Cited

U.S. PATENT DOCUMENTS

| | | | |
|---|---|---|---|
| 7,520,038 B2 * | 4/2009 | Li | ................................. 29/25.35 |
| 2008/0145292 A1 * | 6/2008 | Shirakawa | ........... C04B 35/4682 423/263 |
| 2009/0085443 A1 * | 4/2009 | Hishinuma et al. | ......... 347/68 X |

FOREIGN PATENT DOCUMENTS

| | | | |
|---|---|---|---|
| JP | 60217674 A | * 10/1985 | ............... 29/25.35 X |
| JP | 2009-242229 | 10/2009 | |
| JP | 2009-252789 | 10/2009 | |
| JP | 2010-219157 | 9/2010 | |
| JP | 2001-223404 | 8/2011 | |

OTHER PUBLICATIONS

Cheng, G et al.; "Ferroelectric Properties of BiFeO3 Thin Films Prepared via a Simple Chemical Solution Deposition" Ferroelectrics, Taylor & Francis Aug. 2010, vol. 406, pp. 1481-1486,1588.

* cited by examiner

*Primary Examiner* — A. Dexter Tugbang
(74) *Attorney, Agent, or Firm* — Workman Nydegger

(57) ABSTRACT

A method of manufacturing a piezoelectric film using a piezoelectric film-forming composition. The piezoelectric film-forming composition contains Bi, Fe, Mn, Ba, and Ti and the mole ratio of Bi to the total amount of Fe and Mn is 1.02 or more 1.08 or less.

7 Claims, 11 Drawing Sheets

METHOD OF MANUFACTURING A LIQUID EJECTING HEAD

CROSS-REFERENCE TO RELATED APPLICATIONS

The entire disclosure of Japanese Patent Application No. 2010-256346, filed Nov. 16, 2010 is expressly incorporated by reference.

BACKGROUND

1. Technical Field

The present invention relates to a method of manufacturing a piezoelectric film composing a piezoelectric element and the like used in a liquid ejecting head and the like, a piezoelectric element, a liquid ejecting head, and a liquid ejecting apparatus.

2. Related Art

There is a piezoelectric element configured to pinch a piezoelectric material exhibiting an electromechanical transduction function, for example, a piezoelectric layer (piezoelectric film) composed of a crystallized dielectric material, between two electrodes. Such a piezoelectric element is mounted in, for example, a liquid ejecting head as an actuator apparatus in a bending vibration mode. Typical examples of the liquid ejecting head include an ink jet-type recording head in which a part of the pressure-generating chambers communicated to the nozzle openings that discharge ink droplets is composed of a vibrating plate, and the vibrating plate is deformed by a piezoelectric element so that the ink in the pressure-generating chambers is pressurized and discharged as ink droplets from the nozzle openings.

Piezoelectric materials used as the piezoelectric layer composing the piezoelectric element need to have high piezoelectric characteristics, and the typical examples include lead zirconate titanate (PZT) (refer to JP-A-2001-223404). In addition, chemical solution methods, such as the sol-gel method in which a colloid solution having an organic metallic compound dissolved in a solvent is coated and the like on an object and then burned or the metal organic deposition (MOD) method, or gas-phase methods, such as the sputtering method, the pulse laser deposition method (PLD method), and the CVD method, are known as the method of manufacturing a piezoelectric layer.

Here, there is a demand for a piezoelectric material having a suppressed lead content from the viewpoint of environmental issues. Examples of the piezoelectric materials containing no lead include $BiFeO_3$-based piezoelectric materials containing Bi and Fe. Specific examples include piezoelectric materials made of mixed crystals of Bi(Fe, Mn) $O_3$, and $BaTiO_3$ (refer to JP-A-2009-252789).

However, a piezoelectric film made of the $BiFeO_3$-based piezoelectric material has a problem in that the strain tolerance amount is relatively small.

SUMMARY

The invention has been made in consideration of these circumferences, and an advantage of some aspects of the invention is to provide a method of manufacturing a piezoelectric film by which a piezoelectric film having a large strain tolerance amount can be manufactured, a piezoelectric element, a liquid ejecting head, and a liquid ejecting apparatus.

A first aspect of the invention for solving the above problem is a method of manufacturing a piezoelectric film including forming a piezoelectric precursor film using a piezoelectric film-forming composition containing Bi, Fe, Mn, Ba, and Ti, and having a Bi/(Fe+Mn) ratio, which is the mole ratio of Bi to the total amount of Fe and Mn, of 1.02 to 1.08; and heating and crystallizing the piezoelectric precursor film.

In this aspect, a piezoelectric film having a large strain tolerance amount can be manufactured by using a piezoelectric film-forming composition containing Bi, Fe, Mn, Ba, and Ti, and having a Bi/(Fe+Mn) ratio of 1.02 to 1.08.

In addition, the Bi/(Fe+Mn) ratio is preferably 1.04 to 1.08. According to this, the oriented strength of the (110) face can be improved.

In addition, the Bi/(Fe+Mn) ratio is preferably 1.02 to 1.06. According to this, the influence of Bi on leak current can be reduced, and leak current can be suppressed.

In addition, the temperature at which the piezoelectric precursor film is heated and crystallized is preferably 600° C. to 850° C. According to this, a piezoelectric film which is crystallized at 600° C. to 850° C. and has a large strain tolerance amount can be manufactured.

A second aspect of the invention is a piezoelectric element having a piezoelectric film formed by the method of manufacturing a piezoelectric film according to the above aspect and electrodes that apply voltages to the piezoelectric film. In this aspect, the piezoelectric element has a large strain amount.

In addition, a third aspect of the invention is a liquid ejecting head equipped with the piezoelectric element as a pressure-generating unit that generates pressure for discharging a liquid in pressure-generating chambers communicated with nozzle openings from the nozzle openings. In this aspect, the liquid ejecting head is equipped with a piezoelectric element having a large strain amount.

In addition, a fourth aspect of the invention is a liquid ejecting apparatus equipped with the liquid ejecting head. In this aspect, since the liquid ejecting apparatus is equipped with a liquid ejecting head having a piezoelectric element with a large strain amount, the liquid ejecting apparatus becomes excellent in terms of piezoelectric characteristics.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
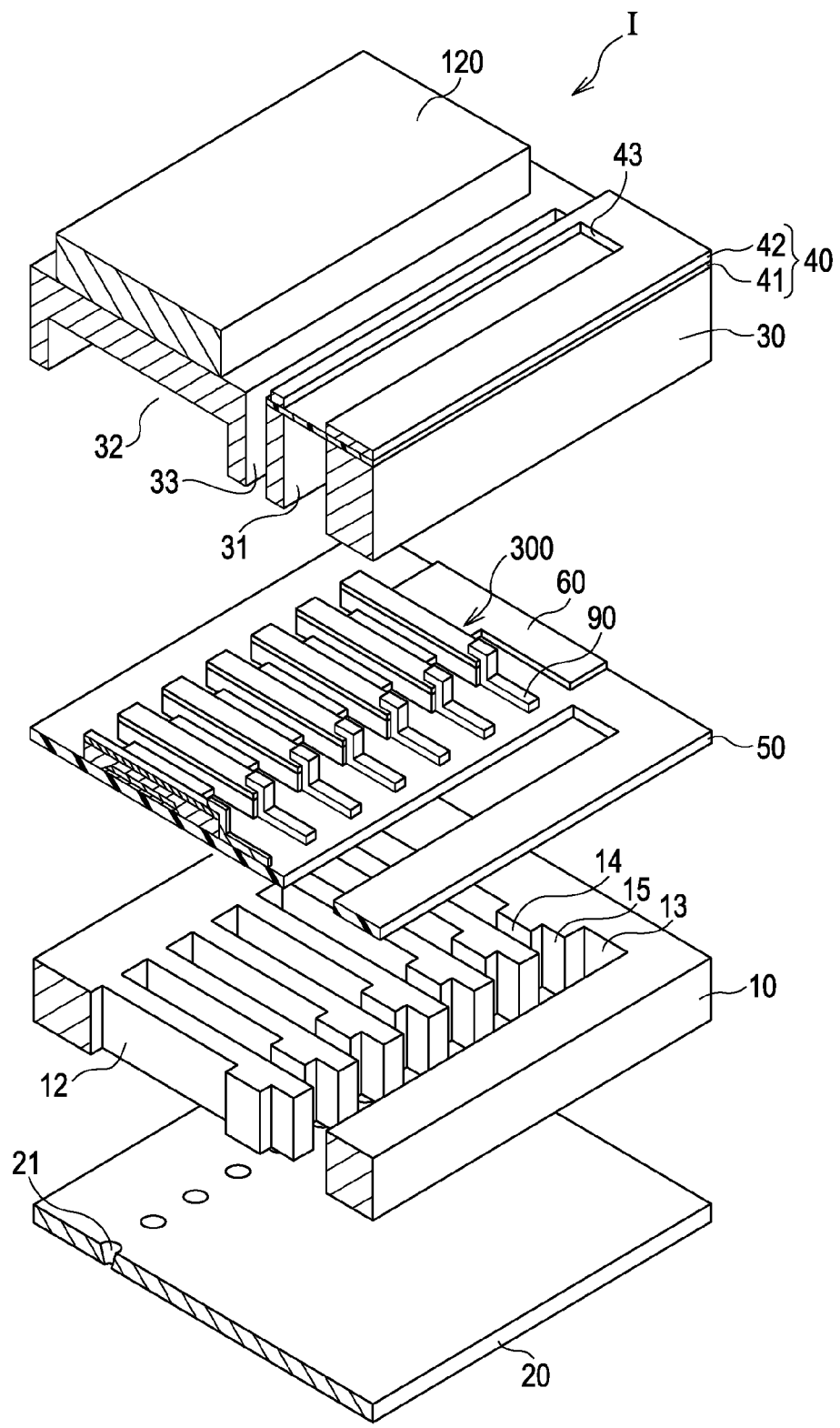
FIG. 1 is an exploded perspective view showing the schematic configuration of the recording head according to the first embodiment.
Figure 2:
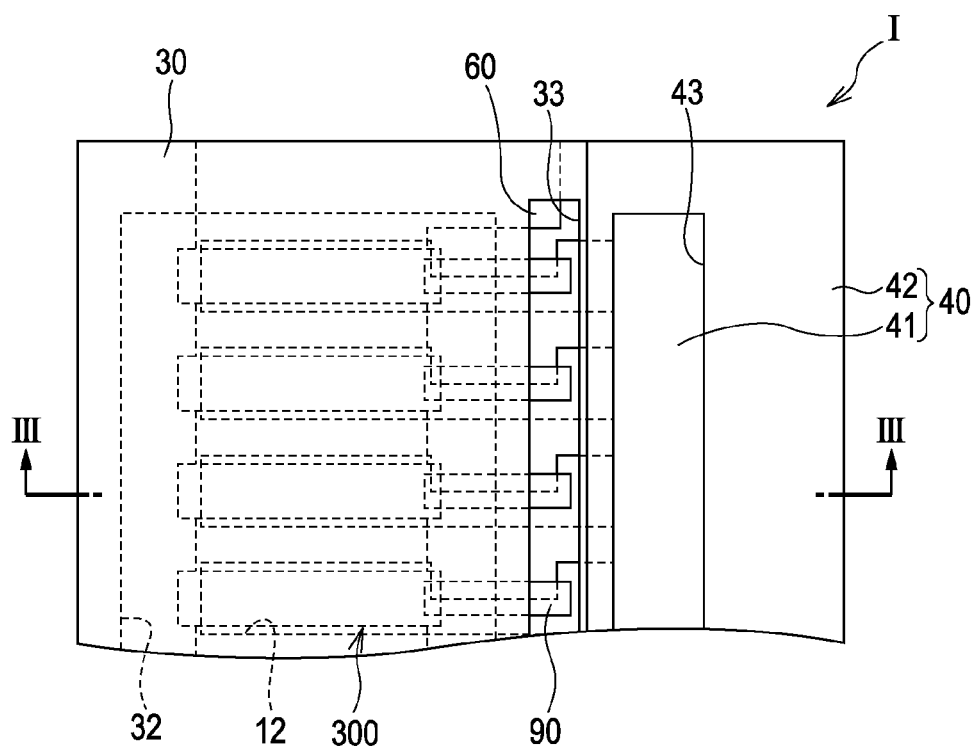
FIG. 2 is a plan view of the recording head according to the first embodiment.
Figure 3:
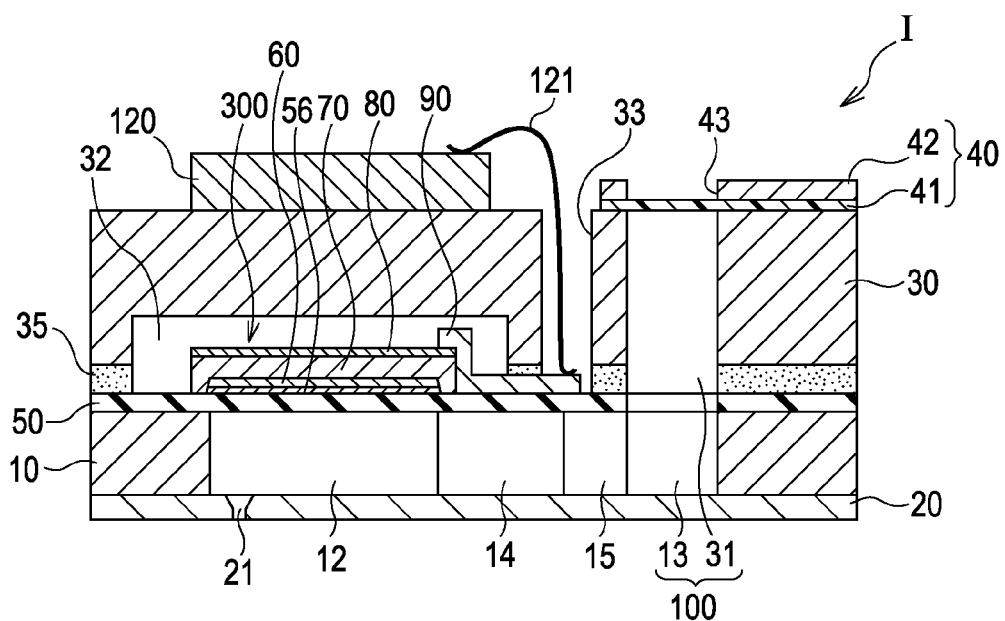
FIG. 3 is a cross-sectional view of the recording head according to the first embodiment.

FIG. 1 is an exploded perspective view showing the schematic configuration of an ink jet-type recording head which is an example of the liquid ejecting head according to the first embodiment of the invention, FIG. 2 is a plan view of FIG. 1, and FIG. 3 is a cross-sectional view taken along the III-III' in FIG. 2. As shown in FIGS. 1 to 3, a flow channel-forming substrate 10 of the present embodiment is made of a silicon single crystal substrate and has an elastic film 50 made of silicon dioxide formed on one surface.

A plurality of pressure-generating chambers 12 are provided in parallel in the width direction in the flow channel-forming substrate 10. In addition, a communicating portion 13 is formed in an area outside the longitudinal direction of the pressure-generating chambers 12 in the flow channel-forming substrate 10, and the communicating portion 13 and each of the pressure-generating chambers 12 are communicated with each other via an ink supply channel 14 and a communicating channel 15 provided at each of the pressure-generating chambers 12. The communicating portion 13 is communicated with a reverser portion 31 of a protective substrate as described below so as to compose a part of a reverser that acts as a common ink chamber to the pressure-generating chambers 12. The ink supply channel 14 is formed to be narrower in the width than the pressure-generating chamber 12, and maintains a constant resistance at the flow channel to ink flowing into the pressure-generating chamber 12 from the communicating portion 13. Meanwhile, the ink supply channel 14 is formed by narrowing the width of the flow channel from one side in the embodiment, but the ink supply channel may also be formed by narrowing the width of the flow channel from both sides. In addition, the ink supply channel may also be formed by narrowing the flow channel in the thickness direction instead of narrowing the width of the flow channel from both sides. In the embodiment, the flow channel-forming substrate 10 is provided with a liquid flow channel composed of the pressure-generating chambers 12, the communicating portion 13, the ink supply channels 14, and the communicating channels 15.

In addition, a nozzle plate 20 provided with punctured nozzle openings 21 that are communicated to the vicinities of the end portions on the opposite side to the ink supply channel 14 in the pressure-generating chambers 12 is fixed to the opening surface side of the flow channel-forming substrate 10 using an adhesive, a thermally weldable film, or the like. Meanwhile, the nozzle plate 20 is made of, for example, a glass ceramic, a silicon single crystal substrate, stainless steel, or the like.

On the other hand, an elastic film 50 is formed on the opposite side to the opening surface of the flow channel-forming substrate 10, and an adhering layer 56 made of, for example, about 30 nm to 50 nm-thick titanium oxide or the like is provided on the elastic film 50 in order to improve the adhesiveness of the elastic film 50 and the like with the foundation of a first electrode 60. Meanwhile, an insulating film made of zirconium oxide or the like may also be provided on the elastic film 50 according to necessity.

Furthermore, the first electrode 60, a piezoelectric layer 70, which is a thin film having a thickness of 2 μm or less, and preferably 0.3 μm to 1.5 μm, and a second electrode 80 are laminated on the adhering layer 56, thereby configuring a piezoelectric element 300. Here, the piezoelectric element 300 refers to a portion including the first electrode 60, the piezoelectric layer 70, and the second electrode 80. Generally, any one of the electrodes in the piezoelectric element 300 forms a common electrode, and the other electrode and the piezoelectric layer 70 are patterned for each of the pressure-generating chambers 12. While the first electrode 60 is used as the common electrode of the piezoelectric element 300, and the second electrode 80 is used as the individual electrode of the piezoelectric element 300 in the embodiment, the pair may be switched according to the circumstances of a driving circuit or wiring. In addition, herein, the piezoelectric element 300 and a vibrating plate which is displaced by the driving of the piezoelectric element 300 will be referred to collectively as an actuator apparatus. Meanwhile, while the elastic film 50, the adhering layer 56, the first electrode 60, and the insulating film as provided according to necessity act as the vibrating plate in the above example, the embodiment is naturally not limited thereto, and, for example, the elastic film 50 or the adhering layer 56 may not be provided. In addition, the piezoelectric element 300 itself may substantially act as the vibrating plate.

In addition, in the invention, although description will be made in detail below, the piezoelectric layer 70 is manufactured by a manufacturing method having a process in which a piezoelectric precursor film is formed using a piezoelectric film-forming composition containing Bi, Fe, Mn, Ba, and Ti, and having a Bi/(Fe+Mn) ratio, which is the mole ratio of Bi to the total amount of Fe and Mn, of 1.02 to 1.08, and a process in which the piezoelectric precursor film is heated and crystallized, and the piezoelectric material composing the piezoelectric layer 70 is a complex oxide having a perovskite structure that includes Bi, Fe, Mn, Ba, and Ti. As such, since the piezoelectric layer 70 is manufactured using a piezoelectric film-forming composition containing Bi, Fe, Mn, Ba, and Ti, and having a Bi/(Fe+Mn) ratio, which is the mole ratio of Bi to the total amount of Fe and Mn, of 1.02 to 1.08, the strain tolerance amount is large as described below in Examples. In addition, when the piezoelectric film-forming composition has a Bi/(Fe+Mn) ratio satisfying 1.04 to 1.08, the piezoelectric layer 70 has a high oriented strength of the (110) face. In addition, when the piezoelectric film-forming composition has a Bi/(Fe+Mn) ratio satisfying 1.02 to 1.06, leak current is suppressed in the piezoelectric layer 70. Meanwhile, in the perovskite structure, that is, an $ABO_3$ structure, the A site is coordinated with 12 oxygen atoms, and the B site is coordinated with 6 oxygen atoms, thereby forming an octahedron. Bi and Ba are located in the A site, and Fe, Mn, and Ti are located in the B site. That is, the complex oxide having the perovskite structure that includes Bi, Fe, Mn, Ba, and Ti is presumed to be a structure in which some Fe in the solid solutions that are evenly formed of bismuth ferrite and barium titanate is substituted with Mn. In addition, as described below, in the invention, since the piezoelectric material composing the piezoelectric layer 70 is formed using a piezoelectric film-forming composition to which 2 mole % to 8 mole % more Bi is added than a stoichiometric composition, it is presumed that Bi is naturally present in the A site, and is also present in crystal grain boundaries and the like.

A lead electrode 90 made of, for example, gold (Au) or the like, which is drawn from the vicinity of the end portion on the ink supply channel 14 side and is extended up to on the elastic film 50 or on the insulating film that is provided according to necessity, is connected to the second electrode 80 which is the individual electrode of the piezoelectric element 300.

The protective substrate 30 having the reverser portion 31 that composes at least a part of a reverser 100 is bonded on the flow channel-forming substrate 10 on which the piezoelectric element 300 is formed, that is, on the first electrode 60, the elastic film 50 or the insulating film provided according to necessity, and the lead electrode 90 using an adhesive 35. In the embodiment, the reverser portion 31 penetrates the protective substrate 30 in the thickness direction, is formed along the width direction of the pressure-generating chambers 12, and is communicated with the communicating portion 13 in the flow channel-forming substrate 10 as described above, thereby forming the reverser 100 that acts as the common ink chamber of the pressure-generating chambers 12. In addition, only the reverser portion 31 may be used as the reverser by dividing the communicating portion 13 in the flow channel-forming substrate 10 into plural sections for each of the pressure-generating chambers 12. Furthermore, for example, the ink supply channel 14 communicating the reverser 100 and each of the pressure-generating chambers 12 to members interposed between the flow channel-forming substrate 10 and the protective substrate 30 (for example, the elastic film 50, the insulating film provided according to necessity, and the like) may be provided by providing only the pressure-generating chambers 12 in the flow channel-forming substrate 10.

In addition, a piezoelectric element supporting portion 32 having a space that does not hinder the movement of the piezoelectric element 300 is provided in an area in the protective substrate 30 which faces the piezoelectric element 300. The piezoelectric supporting portion 32 is simply required to have a space that does not hinder the movement of the piezoelectric element 300, and the space may or may not be sealed.

It is preferable to use materials having substantially the same coefficient of thermal expansion as the flow channel-forming substrate 10, for example, glass, ceramics, and other materials, for the protective substrate 30, and the protective substrate was formed using a silicon single crystal substrate made of the same material as the flow channel-forming substrate 10 in the embodiment.

In addition, a penetrating hole 33 that penetrates the protective substrate 30 in the thickness direction is provided in the protective substrate 30. In addition, the penetrating hole is provided so that the vicinity of the end portion of the lead electrode 90 drawn from each of the piezoelectric elements 300 is exposed in the penetrating hole 33.

In addition, a driving circuit 120 is fixed to the protective substrate 30 in order to drive the piezoelectric elements 300 provided in parallel. It is possible to use, for example, a circuit substrate, a semiconductor integrated circuit (IC), and the like as the driving circuit 120. In addition, the driving circuit 120 and the lead electrode 90 are electrically connected via a connecting wire 121 composed of a conductive wire, such as a bonding wire.

A compliance substrate 40 composed of a sealing film 41 and a fixing plate 42 is bonded on the protective substrate 30. Here, the sealing film 41 is made of a material having low stiffness and flexibility, and one surface of the reverser portion 31 is sealed by the sealing film 41. In addition, the fixing plate 42 is formed of a relatively hard material. Since the area of the fixing plate 42 facing the reverser 100 forms an opening portion 43 that is fully removed in the thickness direction, the one surface of the reverser 100 is sealed only by the sealing film 41 having flexibility.

In the ink jet-type recording head I of the embodiment, an ink is imported from an ink introducing opening connected with an external ink supplying section, not shown, the inside from the reverser 100 to the nozzle openings 21 is filled with the ink, a voltage is applied between each pair of the first electrode 60 and the second electrode 80 which corresponds to the pressure-generating chamber 12 according to recording signals from the driving circuit 120, and the elastic film 50, the adhering layer 56, the first electrode 60, and the piezoelectric layer 70 are bent, thereby increasing the pressure in each of the pressure-generating chambers 12 and discharging ink droplets from the nozzle openings 21.

Next, an example of the method of manufacturing the ink jet-type recording head of the embodiment will be described with reference to FIGS. 4A to 8B. Meanwhile, FIGS. 4A to 8B are cross-sectional views of the pressure-generating chamber in the longitudinal direction.

Figure 4A:
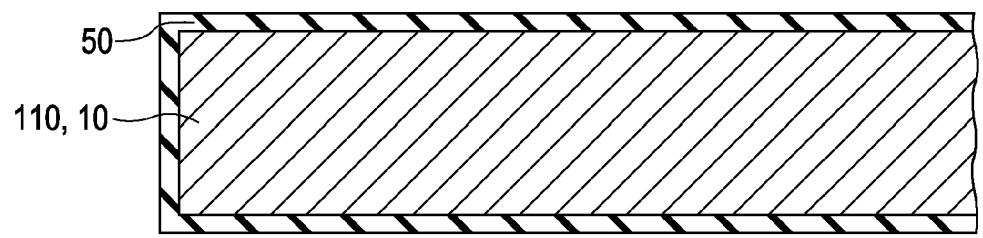
FIGS. 4A and 4B are cross-sectional views showing a process of manufacturing the recording head according to the first embodiment.
Figure 4B:
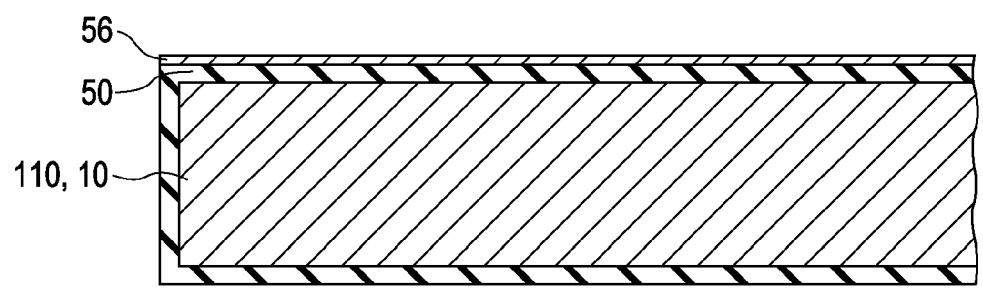

Firstly, as shown in FIG. 4A, a silicon dioxide film made of silicon dioxide ($SiO_2$) or the like composing the elastic film 50 is formed on the surface of a flow channel-forming substrate wafer 110, which is a silicon wafer, by thermal oxidation or the like. Next, as shown in FIG. 4B, the adhering layer 56 made of titanium oxide or the like is formed on the elastic film 50 (silicon dioxide film) by the sputtering method, thermal oxidation, or the like.

Figure 5A:
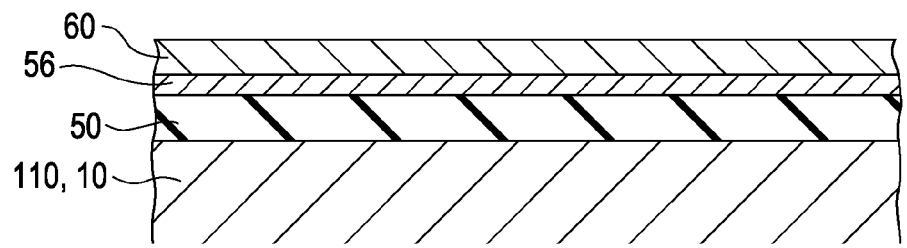
FIGS. 5A to 5C are cross-sectional views showing the process of manufacturing the recording head according to the first embodiment.

Next, as shown in FIG. 5A, the first electrode 60 made of platinum, iridium, iridium oxide, or laminate structures thereof is formed throughout the entire surface of the adhering layer 56 by the sputtering method or the like.

Next, the piezoelectric layer 70 is laminated on the first electrode 60. The piezoelectric layer 70 can be formed by chemical solution methods, such as the metal-organic decomposition (MOD) method, the sol-gel method, or the like, in which a solution having an organic metallic compound dissolved and dispersed in a solvent is coated, dried, and, furthermore, burned at a high temperature, thereby obtaining the piezoelectric layer (piezoelectric film) composed of a metallic compound, or liquid-phase methods, such as the sputtering method, the pulse•laser•deposition method (PLD method), the CVD method, and the like.

Specifically, the piezoelectric layer 70 can be formed by forming a piezoelectric precursor film using a predetermined piezoelectric film-forming composition, and heating and crystallizing a piezoelectric precursor film. In addition, the piezoelectric precursor film-forming composition contains Bi, Fe, Mn, Ba, and Ti, and has a Bi/(Fe+Mn) ratio, which is the mole ratio of Bi to the total amount of Fe and Mn, of 1.02 to 1.08 in the invention.

The piezoelectric layer 70 made of a complex oxide having the perovskite structure that includes Bi, Fe, Mn, Ba, and Ti is formed by using and crystallizing the piezoelectric precursor film-forming composition containing Bi, Fe, Mn, Ba, and Ti. In addition, since the complex oxide has some Fe in bismuth ferrite ($BiFeO_3$) substituted with Mn, the Bi/(Fe+Mn) ratio as described above, which is the mole ratio of Bi to the total amount of Fe and Mn is 1.00 in the stoichiometric composition. However, a piezoelectric precursor film-forming composition having a Bi/(Fe+Mn) ratio, which is the mole ratio of Bi to the total amount of Fe and Mn, of 1.02 to 1.08, that is, a piezoelectric film-forming composition to which Bi is added more than stoichiometry by 2 mole % to 8 mole % is used in the invention.

As such, the piezoelectric layer 70 having a large strain tolerance amount can be formed by using a piezoelectric precursor film-forming composition having a Bi/(Fe+Mn) ratio, which is the mole ratio of Bi to the total amount of Fe and Mn, of 1.02 to 1.08. In addition, the crystallinity is improved and the oriented strength of the (110) face becomes high in the piezoelectric layer 70 by using a piezoelectric precursor film-forming composition having a Bi/(Fe+Mn) ratio of 1.04 to 1.08. In addition, when a piezoelectric film-forming composition having a large content of Bi is used, the leak current of the piezoelectric layer 70 is increased, but the influence of Bi on the increase in the leak current of the piezoelectric layer 70 can be reduced by using a piezoelectric precursor film-forming composition having the Bi/(Fe+Mn) ratio in 1.02 to 1.06, whereby leak current is suppressed in the piezoelectric layer 70.

Other elements may be added in the stoichiometric compositional ratio. Specifically, Ba and Ti may be added to the piezoelectric film-forming composition so that the mole ratio of Ba to Ti becomes 1:1. For example, when a piezoelectric precursor film-forming composition having a Bi/(Fe+Mn) ratio (mole ratio) of 1.02 to 1.08 is produced, the ratio of each of the elements may be, by the mole ratio, Bi:Ba:Fe:Mn:Ti= (a×1.02) to (a×1.08):1−a:a×(1−b):a×b:1−a (0.6≤a≤0.9, 0.01≤b≤0.1). In addition, when a piezoelectric precursor film-forming composition having a Bi/(Fe+Mn) ratio (mole ratio) of 1.04 to 1.08 is produced, the ratio of each of the elements may be, by the mole ratio, Bi:Ba:Fe:Mn:Ti=(a× 1.04) to (a×1.08): 1−a:a×(1−b):a×b:1−a (0.6≤a≤0.9, 0.01≤b≤0.1), and, when a piezoelectric precursor film-forming composition having a Bi/(Fe+Mn) ratio (mole ratio) of 1.02 to 1.06 is produced, the ratio of each of the elements may be, by the mole ratio, Bi:Ba:Fe:Mn:Ti=(a×1.02) to (a×1.06): 1−a:a×(1−b):a×b:1−a (0.6≤a≤0.9, 0.01≤b≤0.1).

Figure 5B:
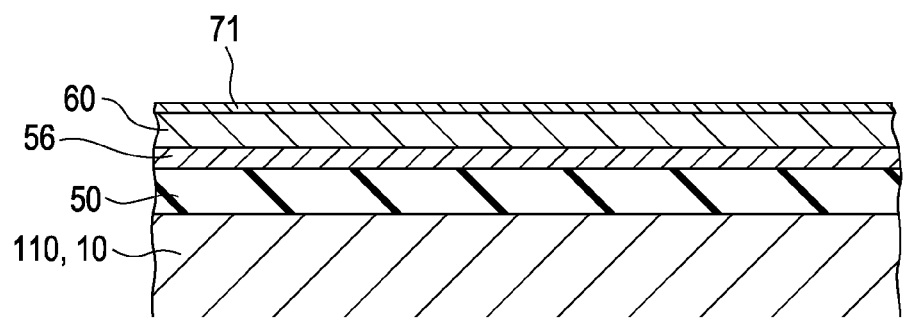

As a specific example of the procedure when the piezoelectric layer 70 is formed by the chemical solution method, firstly, a piezoelectric precursor film 71 is formed on the first electrode 60 by coating a piezoelectric film-forming composition (precursor solution) composed of a sol or an MOD solution including an organic metallic compound, specifically, an organic metallic compound containing Bi, Fe, Mn, Ba, Ti, and the like in a ratio at which the Bi/(Fe+Mn) ratio, which is the mole ratio of Bi to the total amount of Fe and Mn, becomes 1.02 to 1.08 by the sputtering method, and the like as shown in FIG. 5B (coating process).

The precursor solution to be coated is obtained by mixing the organic metallic compound including Bi, Fe, Mn, Ba, and Ti respectively so that each metal becomes the above predetermined mole ratio, and dissolving or dispersing the mixture using an organic solvent, such as alcohol. Examples of the organic metallic compounds including Bi, Fe, Mn, Ba, and Ti respectively that can be used include metal alkoxides, organic acid salts, β diketone complex, and the like. Examples of the organic metallic compound including Bi include 2-ethylhexanoic acid bismuth, and the like. Examples of the organic metallic compound including Fe include 2-ethylhexanoic acid iron, and the like. Examples of the organic metallic compound including Mn include 2-ethylhexanoic acid manganese, and the like. Examples of the organic metallic compound including Ba include barium isopropoxide, 2-ethylhexanoic acid barium, barium acetylacetonate, and the like. Examples of the organic metallic compound containing Ti include titanium isopropoxide, 2-ethylhexanoic acid titanium, titanium(di-i-propoxide)bis(acetylacetonate), and the like. Naturally, organic metallic compounds including two or more of Bi, Fe, Mn, Ba, and Ti may be used.

Next, the piezoelectric precursor film 71 is heated to a predetermined temperature (for example, 150° C. to 200° C.) and dried for a certain amount of time (drying process). Next, the dried piezoelectric precursor film 71 is heated to a predetermined temperature (for example, 350° C. to 450° C.) and retained for a certain amount of time, thereby carrying out delipidation (delipidating process). The delipidation as mentioned herein refers to separating the organic components included in the piezoelectric precursor film 71 in the form of, for example, $NO_2$, $CO_2$, $H_2O$, and the like. The atmosphere in the drying process or the delipidating process is not limited, and the atmosphere, an oxygen atmosphere, or an inert gas may also be used. Meanwhile, the coating process, the drying process, and the delipidation process may be carried out plural times.

Figure 5C:
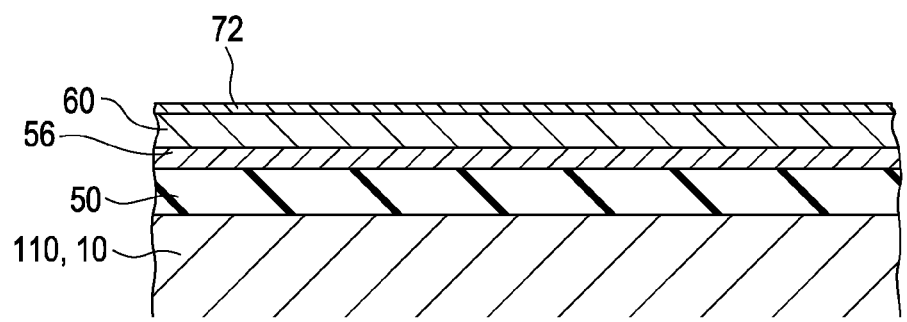

Next, as shown in FIG. 5C, the piezoelectric precursor film 71 is heated to a predetermined temperature, for example, about 600° C. to 850° C. and retained for a certain amount of time, for example, for one minute to 10 minutes, thereby crystallizing the piezoelectric precursor film and forming a piezoelectric film 72 having the perovskite structure that includes Bi, Fe, Mn, Ba, and Ti (burning process). Even in the burning process, the atmosphere is not limited, and the atmosphere, an oxygen atmosphere, or an inert gas may also be used.

Meanwhile, examples of a heating apparatus that is used in the drying process, the delipidation process, and the burning process include a rapid thermal annealing (RTA) apparatus that carries out heating by irradiation of an infrared lamp, a hot plate, and the like.

An example in which the piezoelectric layer 70 is formed by the chemical solution method was shown above, but the piezoelectric layer may be formed by the liquid-phase methods as described above. For example, when the piezoelectric layer 70 is manufactured by the sputtering method, it is possible to form a piezoelectric precursor film with a target made of the piezoelectric film-forming composition, and then carry out the same burning process as above, thereby crystallizing the piezoelectric precursor film and forming the piezoelectric layer 70 made of a complex oxide having the perovskite structure that contains Bi, Fe, Mn, Ba, and Ti.

Figure 6A:
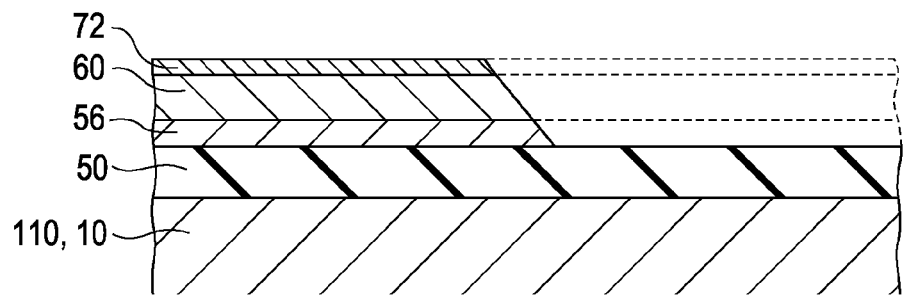
FIGS. 6A and 6B are cross-sectional views showing the process of manufacturing the recording head according to the first embodiment.

Next, as shown in FIG. 6A, the first electrode 60 and the first layer of the piezoelectric film 72 are patterned at the same time on the piezoelectric film 72 using a predetermined-shaped register (not shown) as a mask so that the side surfaces thereof become slanted.

Figure 6B:
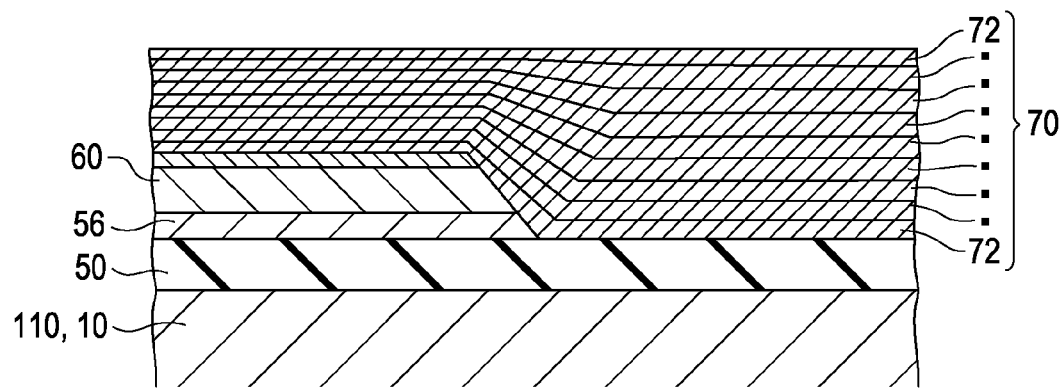

Next, after the register is separated, the coating process, the drying process, and the delipidation process, or the coating process, the drying process, the delipidation process, and the burning process are repeated plural times depending on a desired film thickness and the like so as to form the piezoelectric layer 70 composed of a plurality of the piezoelectric films 72, thereby forming a predetermined-thickness piezoelectric layer 70 composed of plural layers of the piezoelectric films 72 as shown in FIG. 6B. For example, when the film thickness is about 0.1 μm for one cycle of a coating solution, the entire film thickness of the piezoelectric layer 70 composed of 10 layers of the piezoelectric films 72 becomes, for example, about 1.1 μm. Meanwhile, the piezoelectric layer is provided by laminating the piezoelectric films 72 in the embodiment, but the piezoelectric layer may be one layer.

Figure 7A:
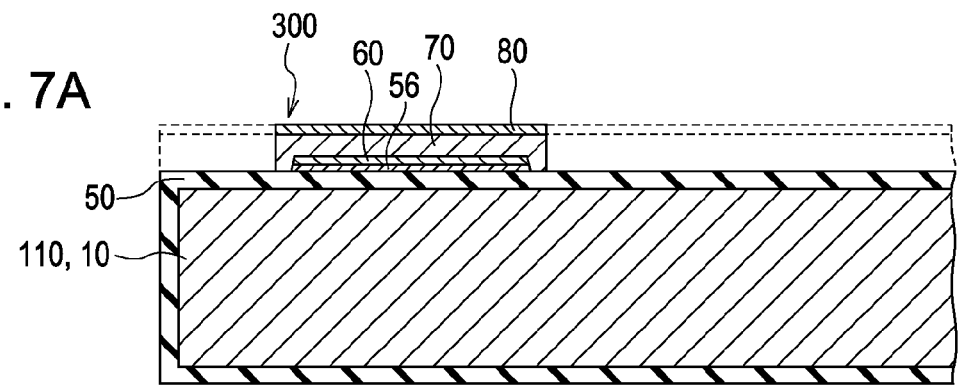
FIGS. 7A to 7C are cross-sectional views showing the process of manufacturing the recording head according to the first embodiment.

After the piezoelectric layer 70 is formed, the second electrode 80 made of platinum or the like is formed on the piezoelectric layer 70 by the sputtering method or the like as shown in FIG. 7A, and the piezoelectric layer 70 and the second electrode 80 are patterned at the same time in the area facing each of the pressure-generating chambers 12, thereby forming the piezoelectric element 300 composed of the first electrode 60, the piezoelectric layer 70, and the second electrode 80. Meanwhile, the patterning of the piezoelectric layer 70 and the second electrode 80 can be carried out in a batch by dry etching via a register formed into a predetermined shape (not shown). After that, post annealing may be carried out in a temperature range of, for example, 600° C. to 850° C. according to necessity. Thereby, favorable interfaces between the piezoelectric layer 70, the first electrode 60, and the second electrode 80 can be formed, and the crystallinity of the piezoelectric layer 70 can be improved.

Figure 7B:
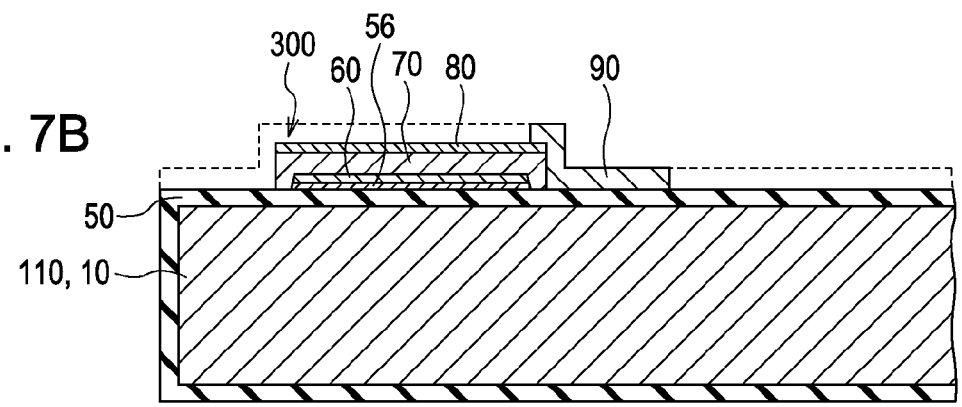

Next, after the lead electrode 90 made of, for example, gold (Au) or the like is formed throughout the entire surface of the flow channel-forming substrate wafer 110 as shown in FIG. 7B, patterning is carried out for each of the piezoelectric elements 300 via, for example, a mask pattern (not shown) composed of a register and the like.

Figure 7C:
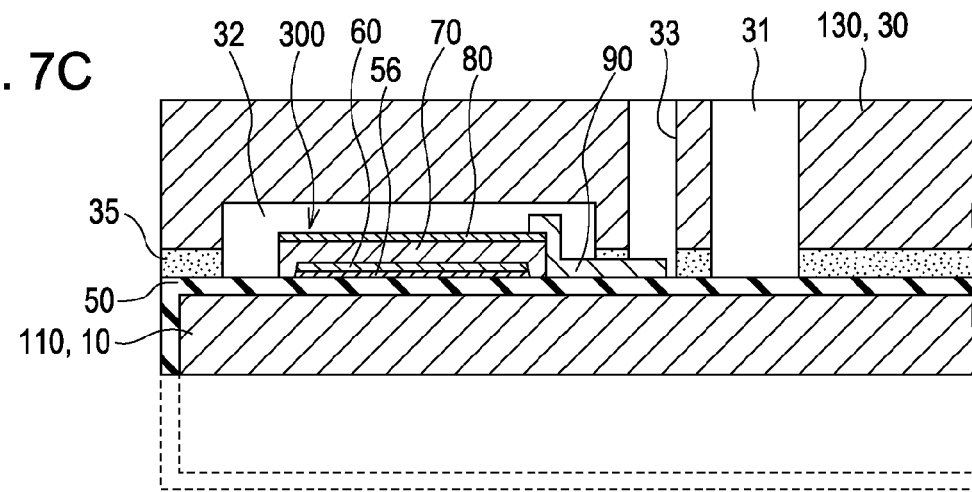

Next, after a protective substrate wafer 130 composed of a plurality of the protective substrates 30, which are silicon wafers, is bonded on the piezoelectric element 300 side of the flow channel-forming substrate wafer 110 via the adhesive 35 as shown in FIG. 7C, the flow channel-forming substrate wafer 110 is made to be thin with a predetermined thickness.

Figure 8A:
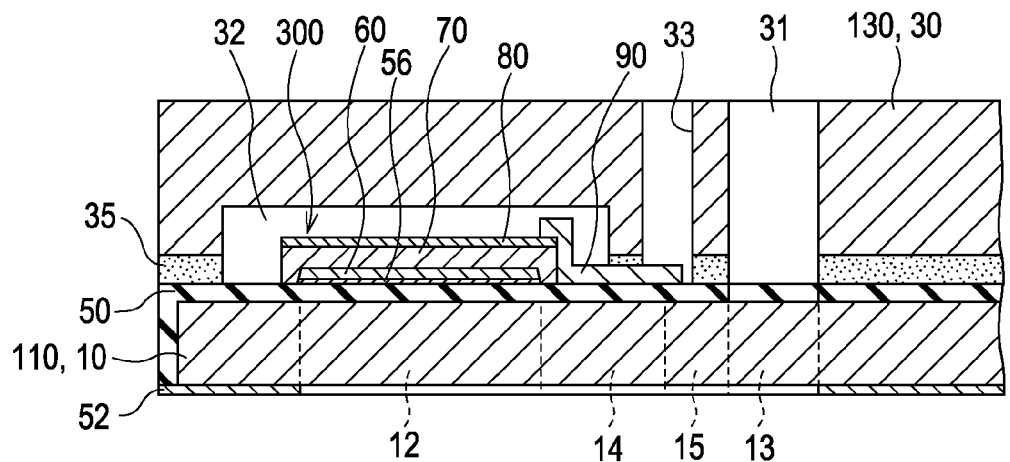
FIGS. 8A and 8B are cross-sectional views showing the process of manufacturing the recording head according to the first embodiment.

Next, a mask film 52 is newly formed on the flow channel-forming substrate wafer 110 as shown in FIG. 8A, and is patterned into a predetermined shape.

Figure 8B:
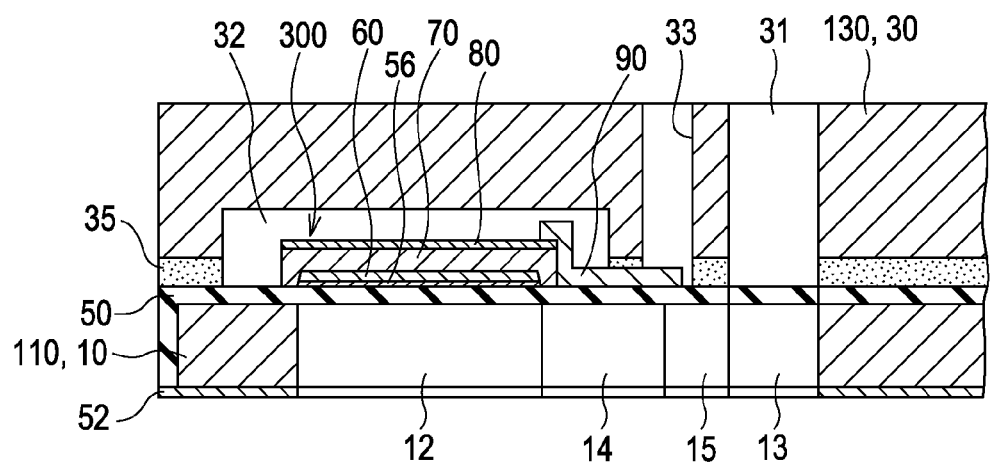

In addition, the pressure-generating chambers 12, the communicating portion 13, the ink supply channel 14, the communicating channel 15, and the like, which correspond to the piezoelectric elements 300, are formed by carrying out anisotropic etching (wet etching) on the flow channel-forming substrate wafer 110 via the mask film 52 using an alkali solution, such as KOH as shown in FIG. 8B.

After that, unnecessary portions in the outer circumferential portions of the flow channel-forming substrate wafer 110 and the protective substrate wafer 130 are removed by carrying out cutting using, for example, dicing or the like. In addition, after the mask film 52 on the surface of the flow channel-forming substrate wafer 110 on the opposite side of the protective substrate wafer 130 is removed, the nozzle plate 20 having the punctured nozzle openings 21 is bonded, and along with this, the compliance substrate 40 is bonded to the protective substrate wafer 130, and the flow channel-forming substrate wafer 110 and the like are divided into the flow channel-forming substrate 10 and the like of one chip size as shown in FIG. 1, thereby manufacturing the ink jet-type recording head I of the embodiment.

EXAMPLES

Hereinafter, examples will be shown, and the invention will be described more specifically. Meanwhile, the invention is not limited to the following examples.

Example 1

Firstly, a 1200 nm-thick silicon dioxide film was formed on the surface of a (100)-oriented single crystal silicon substrate by thermal oxidation. Next, a 40 nm-thick titanium film was formed on the silicon dioxide film by the RF magnetron sputtering method, and thermally oxidized, thereby forming a titanium oxide film. Next, a 100 nm-thick platinum film was formed on the titanium oxide film by the RF magnetron sputtering method, thereby manufacturing a (111)-oriented first electrode 60.

Next, the piezoelectric layer 70 was formed on the first electrode 60 by the spin coating method. The method is as follows. Firstly, the n-butanol solutions of 2-ethylhexanoic acid bismuth, iron acetylacetonate, barium acetate, titanium isopropoxide, and manganese acetylacetonate were mixed in a predetermined ratio, and each of the metals was mixed so that Bi:Ba:Fe:Mn:Ti became 0.765:0.25:0.7125:0.0375:0.25 by the mole ratio, thereby preparing a precursor solution.

In addition, the precursor solution was dropped on the substrate having the titanium oxide film and the first electrode 60 formed thereon, and the substrate was rotated at 3000 rpm, thereby forming a piezoelectric precursor film (coating process). Next, the substrate was mounted on a hot plate, and dried at 180° C. for 2 minutes (drying process). Next, the substrate was mounted on the hot plate, and delipidation was carried out at 450° C. for 2 minutes (delipidating process). After the process composed of the coating process, the drying process, and the delipidating process was repeated two times, burning was carried out in an oxygen atmosphere by rapid thermal annealing (RTA) at 750° C. for 5 minutes (burning process).

Next, after the process composed of the coating process, the drying process, and the delipidating process was repeated four times, a process in which the burning process for burning in a batch is carried out was repeated two times, and an overall 540 nm-thick piezoelectric layer 70 was formed by coating a total of 10 times.

After that, a 100 nm-thick platinum film was formed on the piezoelectric layer 70 as the second electrode 80 by the DC sputtering method, and then burning was carried out using RTA at 750° C. for 5 minutes, thereby forming the piezoelectric element 300 having a complex oxide having the perovskite structure as the piezoelectric layer 70.

Examples 2 to 4 and Comparative Examples 1 to 2

The piezoelectric element 300 was formed in the same manner as Example 1 except that the precursor solution had the element ratio shown in Table 1 by changing the mixing ratio of each of the elements in the precursor solution.

TABLE 1

| | Mole ratio of the elements in the precursor solution Bi:Ba:Fe:Mn:Ti | | | | | Bi/(Fe + Mn) ratio (mole ratio) |
|---|---|---|---|---|---|---|
| | Bi | Ba | Fe | Mn | Ti | |
| Comparative Example 1 | 0.75 | 0.25 | 0.7125 | 0.0375 | 0.25 | 1.00 |
| Example 1 | 0.765 | 0.25 | 0.7125 | 0.0375 | 0.25 | 1.02 |
| Example 2 | 0.78 | 0.25 | 0.7125 | 0.0375 | 0.25 | 1.04 |
| Example 3 | 0.795 | 0.25 | 0.7125 | 0.0375 | 0.25 | 1.06 |
| Example 4 | 0.81 | 0.25 | 0.7125 | 0.0375 | 0.25 | 1.08 |
| Comparative Example 2 | 0.825 | 0.25 | 0.7125 | 0.0375 | 0.25 | 1.10 |

Test Example 1

With regard to the piezoelectric element of each of Examples 1 to 4 and Comparative Examples 1 to 2, the strain tolerance amount in the d33 direction and the strain ratio (strain rate) were obtained by applying a voltage with a frequency of 1 kHz at room temperature (25° C.) using a double beam laser interferometer (DBLI) manufactured by aix-ACCT Systems Inc. and an electrode pattern of φ=500 μm. The values at the applied electric field of 55 kV/cm are shown in Table 2 and FIG. 9.

Figure 9:
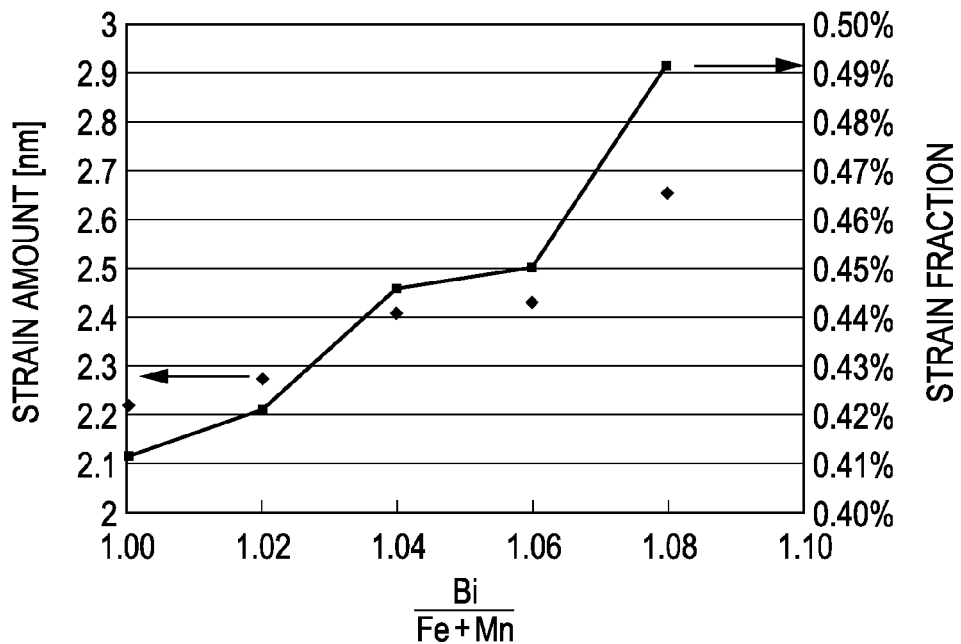
FIG. 9 is a view showing the relationship between the Bi/(Fe+Mn) ratio (mole ratio), the strain amount, and the strain ratio.

As a result, as shown in Table 2 and FIG. 9, the strain amounts and the strain ratios were large in Examples 1 to 4 in which the Bi/(Fe+Mn) ratio, which was the mole ratio of Bi to the total amount of Fe and Mn included in the precursor solution (the piezoelectric film-forming composition), was 1.02 to 1.08 in comparison to Comparative Example 1 in which the Bi/(Fe+Mn) ratio was 1.00. In addition, the piezoelectric element 300 was broken by leak current in Comparative Example 2. It was found that the strain tolerance amount can be increased by adjusting the Bi/(Fe+Mn) ratio to 1.02 to 1.08.

TABLE 2

|  | Bi/(Fe + Mn) ratio (mole ratio) | Strain tolerance amount (nm) | Strain ratio (%) |
| --- | --- | --- | --- |
| Comparative Example 1 | 1.00 | 2.22 | 0.41 |
| Example 1 | 1.02 | 2.27 | 0.42 |
| Example 2 | 1.04 | 2.41 | 0.45 |
| Example 3 | 1.06 | 2.43 | 0.45 |
| Example 4 | 1.08 | 2.65 | 0.49 |

Test Example 2

Figure 10:
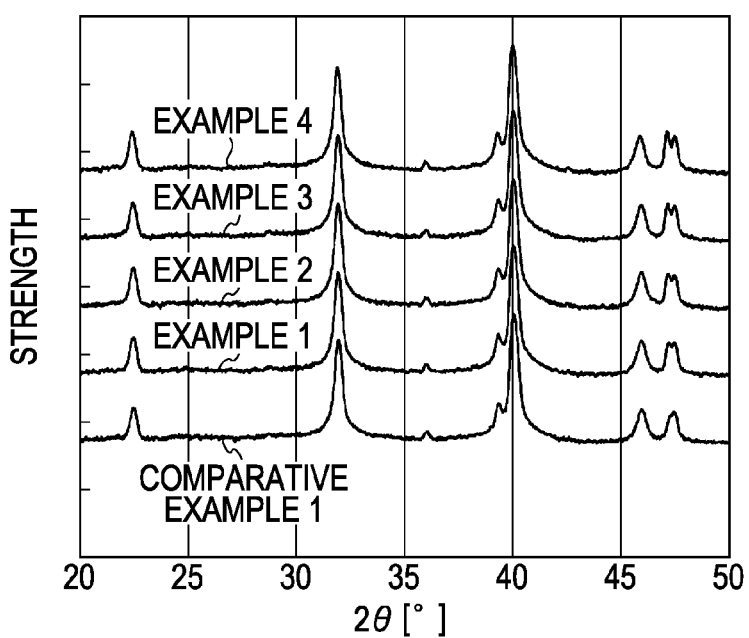
FIG. 10 is a view showing the X-ray diffraction patterns of Examples 1 to 4 and Comparative Example 1.
Figure 11:
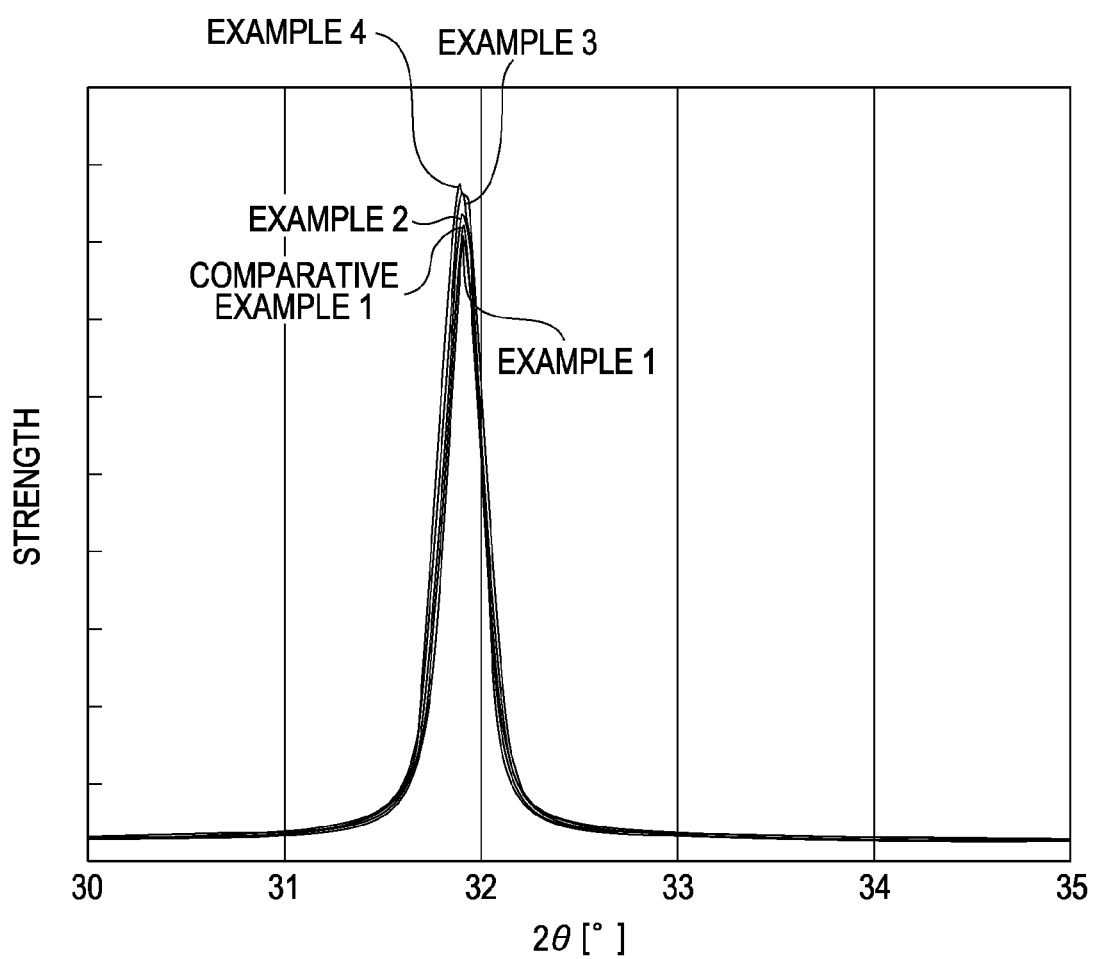
FIG. 11 is a view showing the X-ray diffraction patterns of Examples 1 to 4 and Comparative Example 1.

With regard to Examples 1 to 4 and Comparative Examples 1 to 2, the powder X-ray diffraction patterns of the piezoelectric layers 70 were obtained at room temperature using a "D8 Discover," manufactured by Bruker AXS and a CuKα ray as the X-ray source. The X-ray diffraction patterns which are views showing the relative relationships between the diffraction intensities and the diffraction angles 2θ of Examples 1 to 4 and Comparative Example 1 are shown in FIGS. 10 and 11. Meanwhile, FIGS. 10 and 11 are enlarged views in which the respective lines in FIG. 9 are drawn to overlap.

As a result, peaks induced by the perovskite structure were observed in Examples 1 to 4 and Comparative Example 1. In addition, the peak intensities of the (110) face were large in Examples 2 to 4 in which the Bi/(Fe+Mn) ratio, which was the mole ratio of Bi to the total amount of Fe and Mn included in the precursor solution (the piezoelectric film-forming composition), was 1.04 to 1.08 in comparison to Comparative Example 1 in which the Bi/(Fe+Mn) ratio was 1.00. In addition, while the peak intensity of the (110) face was larger in Comparative Example 2 than Comparative Example 1, a foreign phase-induced peak was observed in the vicinity of 30°. Therefore, it was found that the crystallinity is improved, and the orientation of the (110) face can be improved when the Bi/(Fe+Mn) ratio is 1.04 to 1.08. Meanwhile, the intensities of the (100) peak or the (111) peak were not changed in Examples 1 to 4 and Comparative Example 1.

Test Example 3

Figure 12:
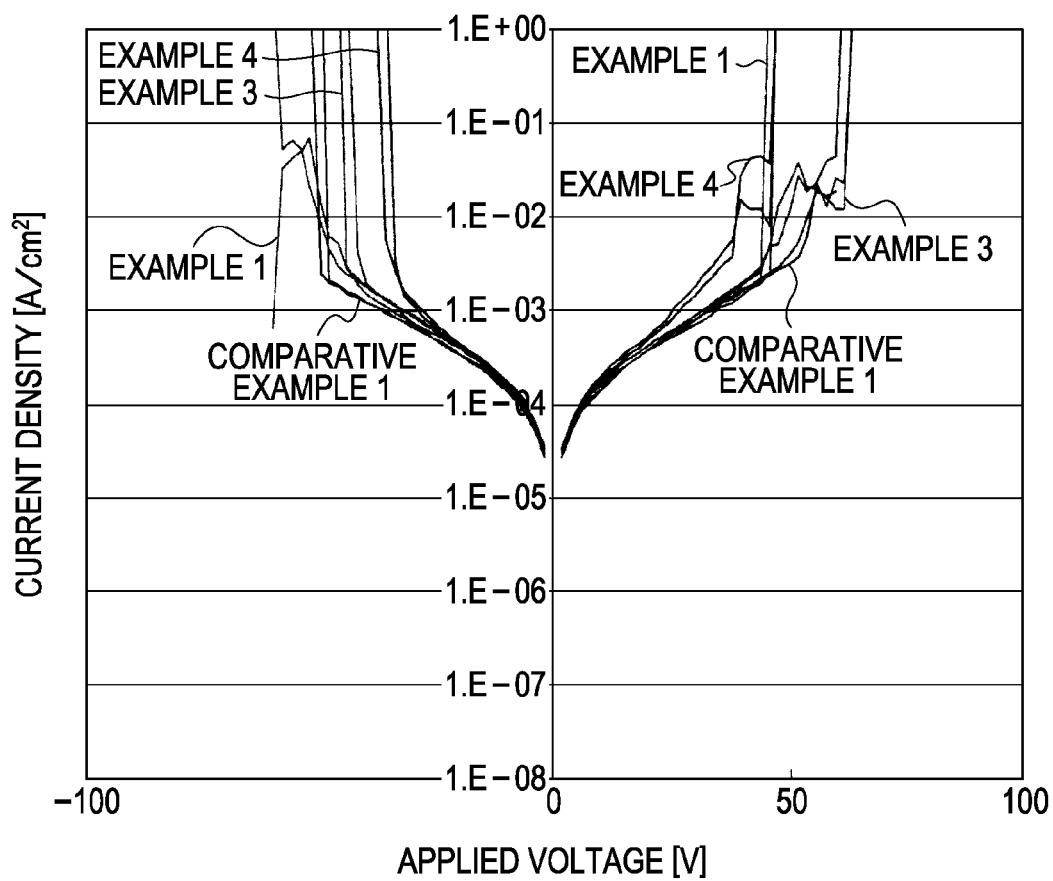
FIG. 12 is a view showing the I-V curves of Examples 1, 3 to 4, and Comparative Example 1.

With regard to the piezoelectric element of each of Examples 1, 3 to 4 and Comparative Examples 1 to 2, the relationships between the current density and the voltage (I-V curve) were obtained by applying voltages every 2 V at room temperature (25° C.) using a "4140B," manufactured by Hewlett-Packard Company with the hold time set to 0.5 seconds and the delay time set to 2 seconds. Meanwhile, the measurement was carried out twice respectively. The results of Examples 1, 3 to 4 and Comparative Example 1 are shown in FIG. 12.

As a result, in Examples 1 and 3, the leak currents were reduced as much as in Comparative Example 1, but the leak current was deteriorated in Example 4. In addition, in Comparative Example 2, the piezoelectric element 300 was broken at 30 V, and the leak characteristics were worse than in Example 4. Therefore, it was found that, when the Bi/(Fe+Mn) ratio, which is the mole ratio of Bi to the total amount of Fe and Mn included in the precursor solution (the piezoelectric film-forming composition) is set to 1.02 to 1.06, the leak characteristics are favorable.

Meanwhile, the same tests as in Test Examples 1 to 3 were carried out on the piezoelectric element 300 manufactured in the same manner as in Examples 1 to 4 except that the burning temperature was set to 600° C. or 850° C. instead of 750° C., but the results were the same as in Examples 1 to 4, in which the strain tolerance amount could be increased by adjusting the Bi/(Fe+Mn) ratio, which is the mole ratio of Bi to the total amount of Fe and Mn included in the precursor solution (the piezoelectric film-forming composition), to 1.02 to 1.08 in comparison to when the Bi/(Fe+Mn) ratio was 1.00, the crystallinity was improved and the orientation of the (110) face could be improved when the Bi/(Fe+Mn) ratio was 1.04 to 1.08, and the leak characteristics were favorable when the Bi/(Fe+Mn) ratio was set to 1.02 to 1.06.

Other Embodiments

Thus far, an embodiment of the invention has been described, but the basic configuration of the invention is not limited to the above. For example, the above embodiment exemplified a silicon single crystal substrate as the flow channel-forming substrate 10, but the flow channel-forming substrate is not limited thereto, and, for example, materials, such as an SOI substrate and glass, may be used.

Furthermore, the above embodiment exemplified the piezoelectric element 300 in which the first electrode 60, the piezoelectric layer 70, and the second electrode 80 are sequentially laminated on a substrate (the flow channel-forming substrate 10), but the piezoelectric element is not limited thereto, and, for example, it is possible to apply the invention even to a vertical vibration-type piezoelectric element in which a piezoelectric material and an electrode-forming material are laminated alternately so as to stretch the piezoelectric element in the width direction.

Figure 13:
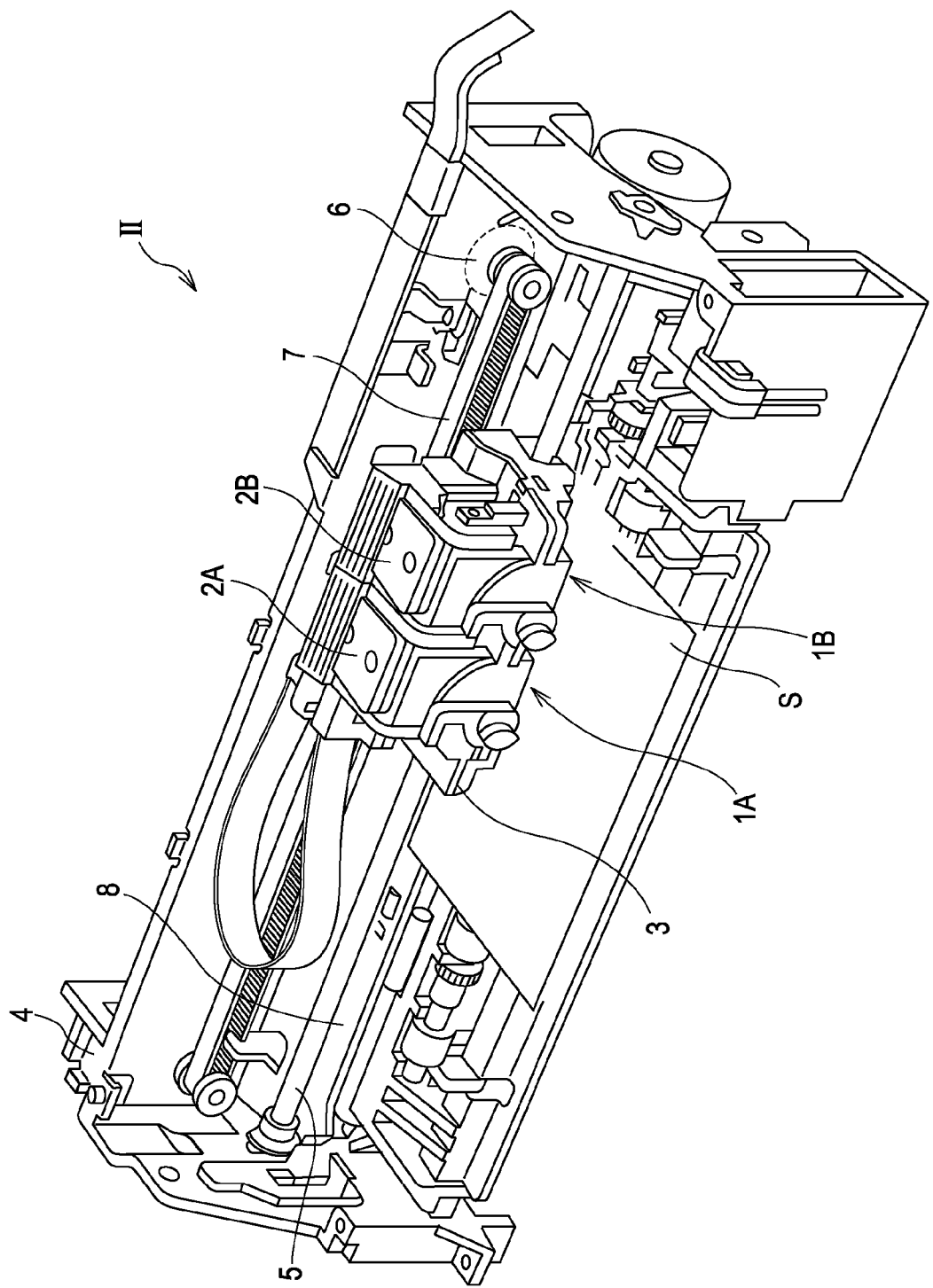
FIG. 13 is a view showing the schematic configuration of the recording apparatus according to the first embodiment of the invention.

In addition, the ink jet-type recording head of the embodiment configures a part of the recording head unit equipped with ink flow channels communicated with an ink cartridge and the like, and is mounted on an ink jet-type recording apparatus. FIG. 13 is a schematic view showing an example of the ink jet-type recording apparatus.

In the ink jet-type recording apparatus II shown in FIG. 13, recording head units 1A and 1B having the ink jet-type recording head I are provided so that cartridges 2A and 2B composing an ink supplying section can be mounted and removed, and a cartridge 3 having the recording head units 1A and 1B mounted thereon is provided so that the cartridge can freely move along the cartridge axis 5 that is attached to an apparatus main body 4. The recording head units 1A and 1B eject a black ink composition and a color ink composition, respectively.

In addition, the cartridge 3 having the recording head units 1A and 1B mounted thereon is moved along the cartridge axis 5 by transmitting the driving force of a driving motor 6 via a plurality of gears, which are not shown, and a timing belt 7. On the other hand, a platen 8 is provided along the cartridge axis 5 in the apparatus main body 4, and a recording sheet S, which is a recording medium, such as paper supplied by a paper supplying roller or the like, which is not shown, is rolled on the platen 8 and transported.

Meanwhile, the above embodiment exemplified the ink jet-type recording head as an example of the liquid ejecting head, but the invention can be applied to an entire range of liquid ejecting heads, and, naturally, can be applied even to liquid ejecting heads that eject liquid other than ink. Examples of other liquid ejecting heads include a variety of recording heads that are used in an image recording apparatus, such as a printer, color material ejecting heads used to manufacture color filters, such as liquid crystal displays, electrode material ejecting heads used to form electrodes, such as organic EL displays, field emission displays (FED), biological organic substance ejecting heads used to manufacture bio chips, and the like.

In addition, the invention is not limited to piezoelectric elements mounted in liquid ejecting heads that are represented by the ink jet-type recording head, and can be applied to piezoelectric elements mounted in apparatuses, such as ultrasonic communicators and other ultrasonic devices, ultrasonic motors, piezoelectric sensors that detect deformation of a piezoelectric layer as an electric signal, pressure sensors, IR sensors, and other pyroelectric elements. In addition, the invention can be similarly applied to ferroelectric elements, such as ferroelectric memories.

What is claimed is:

1. A method of manufacturing a piezoelectric film, comprising:
   forming a piezoelectric precursor film using a piezoelectric film-forming composition; and
   crystallizing the piezoelectric precursor film,
   wherein the piezoelectric film-forming composition contains Bi, Fe, Mn, Ba, and Ti with a molar excess Bi relative to the combined molar amounts of Fe and Mn and the molar mole ratio of Bi to the total amount of Fe and Mn (Bi/(Fe+Mn)) is 1.02 or more and 1.08 or less, and the molar ratio of the total amount of Bi and Ba is not equal to the molar ratio of the total amount of Fe, Mn and Ti.

2. The method of manufacturing a piezoelectric film according to claim 1,
   wherein the molar ratio of Bi to the total amount of Fe and Mn is 1.04 or more and 1.08 or less.

3. The method of manufacturing a piezoelectric film according to claim 1,
   wherein the molar ratio of Bi to the total amount of Fe and Mn is 1.02 or more and 1.06 or less.

4. The method of manufacturing a piezoelectric film according to claim 1,
   wherein the temperature at which the piezoelectric precursor film is crystallized is 600° C. to 850° C.

5. A method of manufacturing a piezoelectric element, comprising:
   forming a piezoelectric film; and
   forming electrodes to the piezoelectric film,
   wherein the piezoelectric film is formed by:
      forming a piezoelectric precursor film using a piezoelectric film-forming composition; and
      crystallizing the piezoelectric precursor film,
      wherein the piezoelectric film-forming composition contains Bi, Fe, Mn, Ba, and Ti with a molar excess Bi relative to the combined molar amounts of Fe and Mn and the molar ratio of Bi to the total amount of Fe and Mn (Bi/(Fe+Mn)) is 1.02 or more and 1.08 or less, and the molar ratio of the total amount of Bi and Ba is not equal to the molar ratio of the total amount of Fe, Mn and Ti.

6. A method of manufacturing a liquid ejecting head, comprising:
   forming a piezoelectric element; and
   forming pressure-generating chambers communicated with a nozzle opening, wherein the piezoelectric element is formed by:
   forming a piezoelectric film; and
   forming electrodes to the piezoelectric film,
   wherein the piezoelectric film is formed by:
      forming a piezoelectric precursor film using a piezoelectric film-forming composition; and
      crystallizing the piezoelectric precursor film,
      wherein the piezoelectric film-forming composition contains Bi, Fe, Mn, Ba, and Ti with a molar excess Bi relative to the combined molar amounts of Fe and Mn and the molar ratio of Bi to the total amount of Fe and Mn (Bi/(Fe+Mn)) is 1.02 or more and 1.08 or less, and the molar ratio of the total amount of Bi and Ba is not equal to the molar ratio of the total amount of Fe, Mn and Ti.

7. A method of manufacturing a liquid ejecting apparatus, comprising:
   forming a liquid ejecting head by:
   forming a piezoelectric element; and
   forming pressure-generating chambers communicated with a nozzle opening,
   wherein the piezoelectric element is formed by:
      forming a piezoelectric film; and
      forming electrodes to the piezoelectric film,
      wherein the piezoelectric film is formed by:
         forming a piezoelectric precursor film using a piezoelectric film-forming composition; and
         crystallizing the piezoelectric precursor film,
         wherein the piezoelectric film-forming composition contains Bi, Fe, Mn, Ba, and Ti with a molar excess Bi relative to the combined molar amounts of Fe and Mn and the molar ratio of Bi to the total amount of Fe and Mn (Bi/(Fe+Mn)) is 1.02 or more and 1.08 or less, and the molar ratio of the total amount of Bi and Ba is not equal to the molar ratio of the total amount of Fe, Mn and Ti.

* * * * *